(12) United States Patent
Urakawa

(10) Patent No.: US 8,237,289 B2
(45) Date of Patent: Aug. 7, 2012

(54) SYSTEM IN PACKAGE DEVICE

(75) Inventor: Yukihiro Urakawa, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 56 days.

(21) Appl. No.: 12/020,190

(22) Filed: Jan. 25, 2008

(65) Prior Publication Data
US 2008/0179735 A1 Jul. 31, 2008

(30) Foreign Application Priority Data

Jan. 30, 2007 (JP) ................................. 2007-020012
Jan. 30, 2007 (JP) ................................. 2007-020013

(51) Int. Cl.
*H01L 23/48* (2006.01)

(52) U.S. Cl. ....................................... 257/777; 361/718

(58) Field of Classification Search .................. 257/684, 257/686, 737, 777
See application file for complete search history.

(56) References Cited

U.S. PATENT DOCUMENTS

| 6,737,743 | B2 | 5/2004 | Urakawa |
| 7,489,030 | B2* | 2/2009 | Shibata et al. ................ 257/686 |
| 7,531,905 | B2* | 5/2009 | Ishino et al. .................. 257/777 |
| 2003/0042591 | A1* | 3/2003 | Goller et al. .................. 257/686 |
| 2004/0164425 | A1 | 8/2004 | Urakawa |
| 2005/0199994 | A1* | 9/2005 | Morishita et al. ............. 257/686 |
| 2006/0148130 | A1 | 7/2006 | Urakawa |

FOREIGN PATENT DOCUMENTS

| JP | 62-232133 | 10/1987 |
| JP | 2-003354 | 1/1990 |
| JP | 04-162767 | 6/1992 |
| JP | 6-112401 | 4/1994 |
| JP | 7-176684 | 7/1995 |
| JP | 10-200062 | 7/1998 |
| JP | 2000-223651 | 8/2000 |
| JP | 2001-024149 | 1/2001 |
| JP | 2001-24150 A | 1/2001 |
| JP | 2002-270759 A | 9/2002 |
| JP | 2003-078104 | 3/2003 |
| JP | 2005-217205 | 3/2003 |
| JP | 2003-324183 | 11/2003 |
| JP | 2003-332520 | 11/2003 |
| JP | 2004-047987 | 2/2004 |
| JP | 2004-207757 | 7/2004 |
| JP | 2005-244143 | 9/2005 |
| JP | 2005-268670 | 9/2005 |
| JP | 2006-108150 | 4/2006 |
| JP | 2006-222252 | 8/2006 |

OTHER PUBLICATIONS

Ezaki et al. "A 160Gb/s Interface Design Configuration for Multichip LSI" Solid-State Circuits Conference 2004 Digest of Technical Papers ISCC 2004. Office Action mailed Sep. 6, 2011, for Patent Application No. 2007-020013 with English language translation, 5 pages, 2004.
Office Action mailed Sep. 27, 2011, for Patent Application No. 2007-020012 with English language translation, 7 pages.
Office Action for Japanese Patent Application No. 2007-020012, mailed Jun. 12, 2012, 6 pgs. (with English translation), Jul. 9, 2012.

* cited by examiner

*Primary Examiner* — Steven Loke
*Assistant Examiner* — Kimberly M Thomas
(74) *Attorney, Agent, or Firm* — Sprinkle IP Law Group

(57) ABSTRACT

A system in package device according to an example of the present invention includes a package substrate, an external terminal which is arranged on one face side or the other face side of the package substrate, a first chip which is arranged on the other face side of the package substrate, a second chip which is arranged on the first chip, and bumps which are arranged between the first chip and the second chip. A signal to be input into the external terminal is input into the first chip via the second chip.

13 Claims, 21 Drawing Sheets

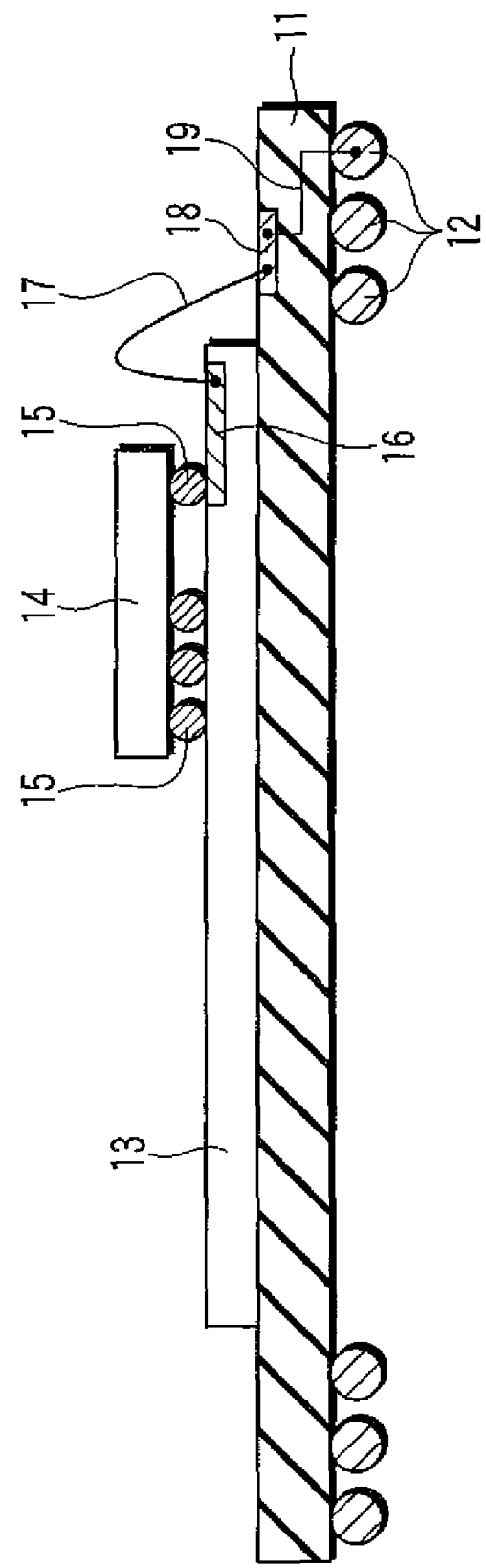
F I G. 2

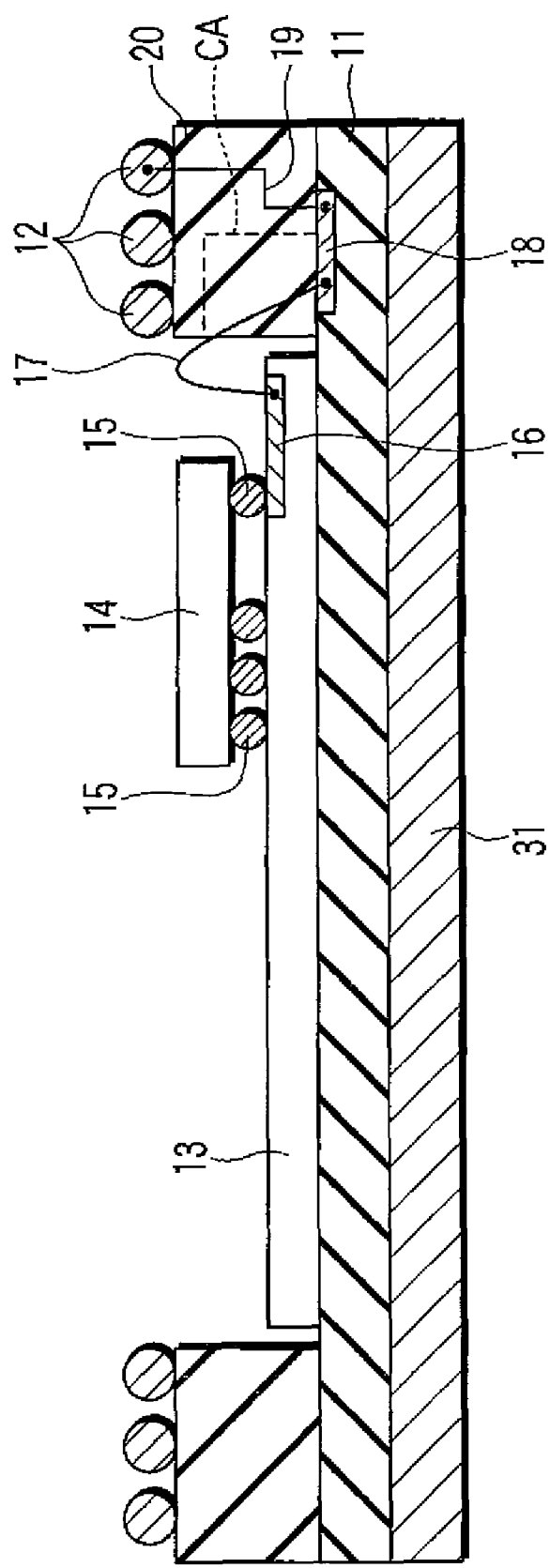
F I G. 4

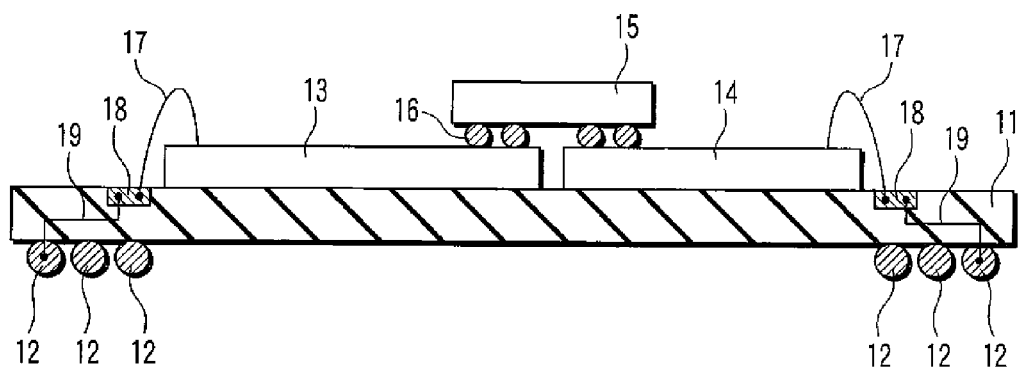
F I G. 15
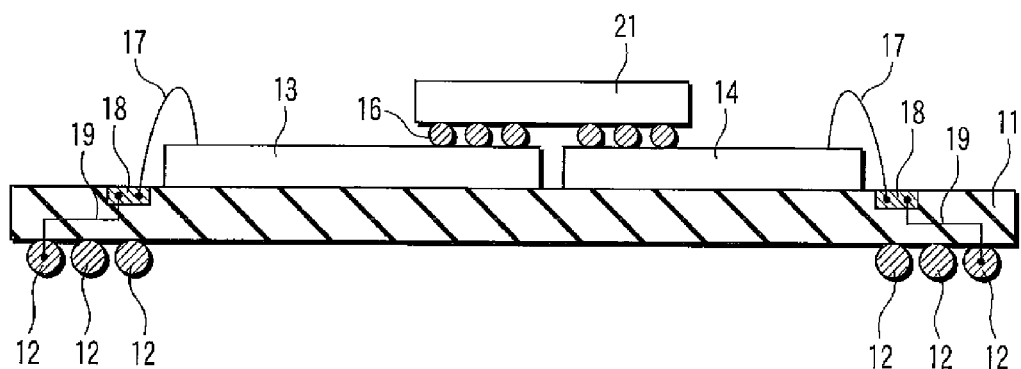
F I G. 16

SYSTEM IN PACKAGE DEVICE

CROSS-REFERENCE TO RELATED APPLICATIONS

This application is based upon and claims the benefit of priority from prior Japanese Patent Applications No. 2007-020012, filed Jan. 30, 2007; and No. 2007-020013, filed Jan. 30, 2007, the entire contents of both of which are incorporated herein by reference.

BACKGROUND OF THE INVENTION

1. Field of the Invention

The present invention relates to a system in package device.

2. Description of the Related Art (1) Problem of First System-in-Package Device

In recent years, in order to combine high performance and low cost of systems, techniques such as SoC (system on chip) where a system is formed on one chip and SIP (system in package) where a system is formed in one package have been developed (for example, see Jpn. Pat. Appln. KOKAI Publication Nos. 7-176684 and 2002-270759).

In the case of SoC, function blocks are formed on one chip.

It is, however, difficult to form the function blocks according to a common process. For example, in high-speed systems having a logic circuit and an interface circuit, the logic circuit is formed by a thin film CMOS process, and the interface circuit is formed by a thick film CMOS process.

For this reason, it is necessary to optimize the process and repress an increase in cost, but this becomes more difficult as the process generations roll by.

On the contrary, in SIP, a problem of the cost in the SoC does not arise.

In the case of SIP, since chips are formed in one package, a logic circuit and an interface circuit can be formed on different chips.

When the performance of systems becomes highly sophisticated, however, the number of chip terminals increases. For this reason, it is difficult to connect chips by wire bonding.

A technique for connecting chips using a bump is, therefore, proposed.

According to this technique, two chips having different functions are stacked via a bump. For example, a memory chip is arranged on a logic chip and both of them are connected to each other via a bump.

In this case, the upper chip is smaller than the lower chip and is flip-chip bonded to the lower chip. For this reason, the front face of the upper chip (the face on which an element is formed; the same applies to the following) faces the front face of the lower chip, and thus a signal terminal of the upper chip is not directly connected to an external terminal of the package.

That is, the upper chip transmits and receives a signal (except for a power-supply voltage) only to/from an element or a circuit formed in the lower chip.

In order to structure high-performance systems, however, the signal terminal of the upper chip is occasionally preferably connected directly to the external terminal of the package without an element or a circuit in the lower chip.

(2) Problem of Second System-in-Package Device

In recent years, in order to combine the high performance and the low cost of the systems, SIP (system in package) where a system is formed in one package has been developed (for example, see Jpn. Pat. Appln. KOKAI Publication No. 2001-24150).

In the case of SIP, since chips are formed in one package, a wiring technique for connecting the chips is important.

SIP includes a parallel type SIP in which chips are arranged in parallel and these chips are connected by a bonding wire, and stacking type SIP in which chips are stacked and these chips are connected by a bump.

In the case of the parallel type SIP, when the number of chip terminals increases according to the heightening of the performance of the systems, the chips cannot be connected to each other in the package.

On the contrary, in the case of the stacking type SIP, a micro-bump having a diameter of 100 μm or less is used so that even if the number of chip terminals increases, the connection of the chips can be sufficiently secured.

In the stacking type SIP, however, it is difficult to add a heat spreader to the package due to its structure.

BRIEF SUMMARY OF THE INVENTION (1) First System-in-Package Device

This system in package device comprises a package substrate an external terminal which is arranged on one face side or the other face side of the package substrate, a first chip which is arranged on the other face side of the package substrate, a second chip which is arranged on the first chip, and bumps which are arranged between the first chip and the second chip. A signal to be input into the external terminal is input into the first chip via the second chip.

This system in package device comprises a package substrate, an external terminal which is arranged on one face side or the other face side of the package substrate, a first chip which is arranged on the other face side of the package substrate, a second chip which is arranged on the first chip and the package substrate so as to straddle them, a first bump which is arranged between the first chip and the second chip, and a second bump which is arranged between the package substrate and the second chip. A signal to be input into the external terminal is input into the first chip via the second chip.

(2) Second System-in-Package Device

This system in package device comprises a package substrate, an external terminal which is arranged on one face side of the package substrate, first and second chips which are arranged side by side on the other face side of the package substrate, a third chip which is arranged to straddle the first and second chips and covers only some portions of the front faces of the first and second chips, and a bump which is arranged between the first and second chips and the third chip. The first and second chips transmit and receive a signal via the third chip.

This system in package device comprises a heat spreader, a package substrate which is arranged along an edge of one face side of the heat spreader, an external terminal which is arranged on the package substrate, first and second chips which are arranged side by side on a center of the one face side of the heat spreader, a third chip which is arranged to straddle the first and second chips, and covers only some portions of front faces of the first and second chips, and a bump which is arranged between the first and second chips and the third chip. The first and second chips transmit and receive a signal via the third chip.

BRIEF DESCRIPTION OF THE SEVERAL VIEWS OF THE DRAWING

FIG. 2 is a cross-sectional view taken along a line II-II of FIG. 1;

FIG. 4 is a cross-sectional view taken along a line IV-IV of FIG. 3;

FIG. 15 is a cross-sectional view taken along a line XV-XV of FIG. 14;

FIG. 16 is a plan view illustrating a modified example of the first example;

DETAILED DESCRIPTION OF THE INVENTION

A system in package device of an aspect of the present invention will be described below in detail with reference to the accompanying drawings.

[A] First System-in-Package Device

1. Outline (1) The present invention is directed to a system in package device which has two chips (first and second chips) stacked on each other via a bump. A constitution of such a system in package device, in which a signal to be input into an external terminal of the package is input into a lower chip (first chip) via an upper chip (second chip), is proposed.

Specifically, firstly, a signal to be input into the external terminal of the package is input into a logic circuit in the upper chip via a conductive layer in the lower chip, and is transferred from the upper chip to the lower chip. That is, the conductive layer as a lead to the upper chip is provided in the lower chip, so that the above constitution is realized.

Secondly, a through hole which pierces the upper chip is formed in the upper chip, and a conductive layer is formed on a rear face of the upper chip (the face on which an element is not formed; the same applies also to the following description). A signal to be input into the external terminal of the package is input into the logic circuit in the second chip via the conductive layer and the through hole, so that the above constitution is realized.

Thirdly, the upper chip is arranged so as to straddle the lower chip and a package substrate (convex portion). That is, a constitution where the upper chip is connected to both of the lower chip and the package substrate via a bump is adopted, so that the above constitution is realized.

The signal means data, and does not include a power-supply voltage.

According to such a constitution, the performance of the system in package device having the two chips stacked on each other via the bump can be heightened.

2. Examples

Some examples which seem to be the best will be described below.

(1) First Example

A. Constitution

Figure 1:
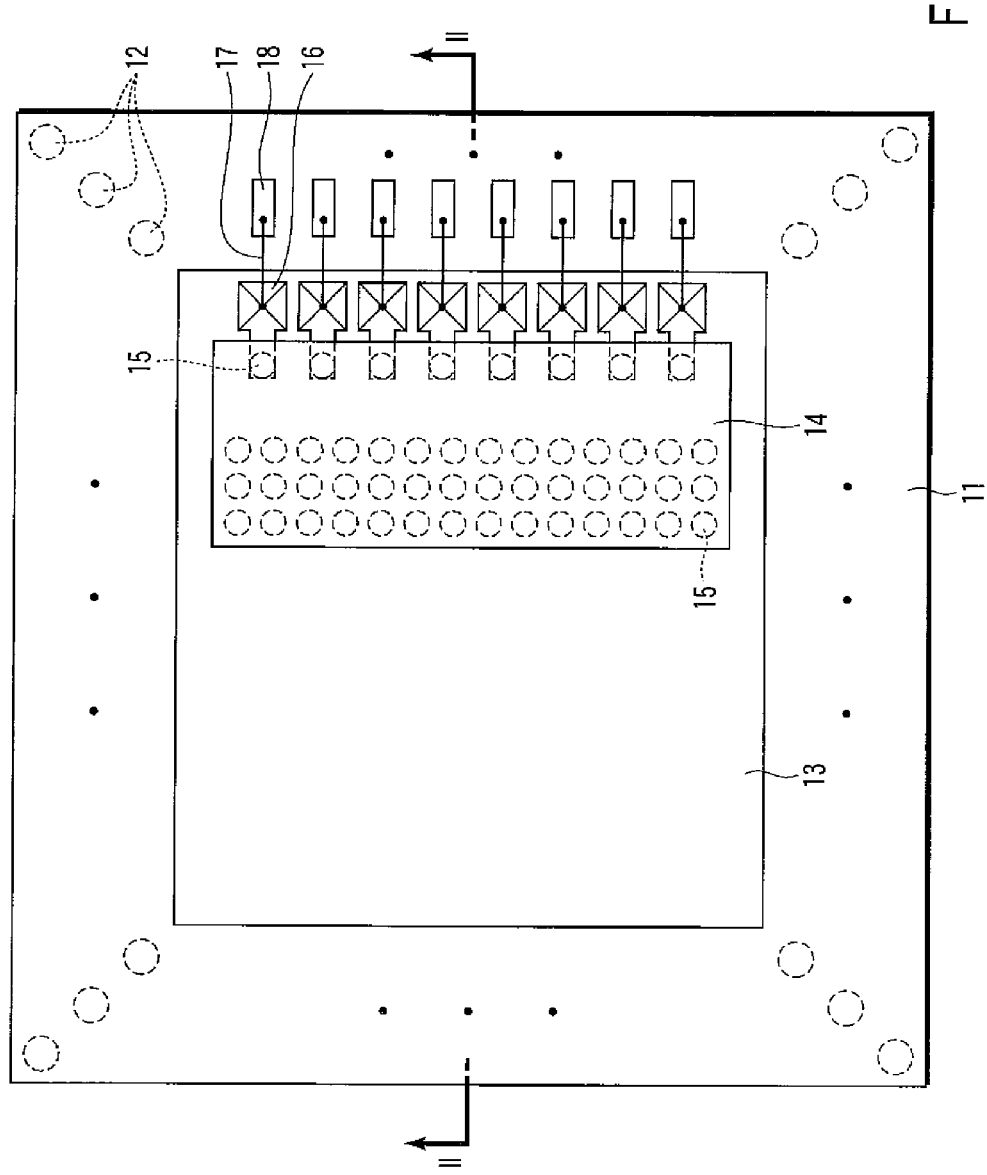
FIG. 1 is a plan view illustrating a first SIP according to a first example.

FIG. 1 illustrates a system in package device according to a first example. FIG. 2 is a cross-sectional view taken along a line II-II of FIG. 1.

External terminals 12 of an array pattern are arranged on one face side of a package substrate 11. In this example, the external terminals 12 are bumps, but the external terminals are not limited to them and thus may be pins, pads or the like.

A lower chip 13 is arranged on the other face side of the package substrate 11. The lower chip 13 is, for example, a logic chip. The rear face of the lower chip 13 is jointed to the other face of the package substrate 11 by adhesive.

An upper chip 14 is arranged on the lower chip 13. The upper chip 14 is a chip having a function different from the lower chip 13, such as an interface chip.

Bumps of array pattern (for example, micro-bumps having diameter of 100 μm or less) 15 are arranged between the lower chip 13 and the upper chip 14.

Since the upper chip 14 is flip-chip bonded to the lower chip 13, the front face of the lower chip 13 is opposed to the front face of the upper chip 14.

Since a size of the upper chip 14 is smaller than a size of the lower chip 13, the front face of the upper chip 14 is completely hidden when viewed from above the package substrate 11.

One of the external terminals 12 is a signal terminal.

In this example, a signal to be input into the signal terminal is input into the lower chip 13 via the upper chip 14. The signal is transmitted to the signal terminal from the lower chip 13 via the upper chip 14, so as to be output to the outside of the package.

That is, the lower chip 13 has conductive layers 16 as leads to the upper chip 14. The package substrate 11 has conductive layers 18, and a conductive line 19 which connects one of the external terminals 12 to the conductive layer 18. A bonding wire 17 connects the conductive layers 16 and 18.

As a result, the external terminal 12 as the signal terminal is connected to the upper chip 14 via the bump 15, the conductive layer 16, the bonding wire 17, the conductive layer 18 and the conductive line 19.

B. Modified Example

Figure 3:
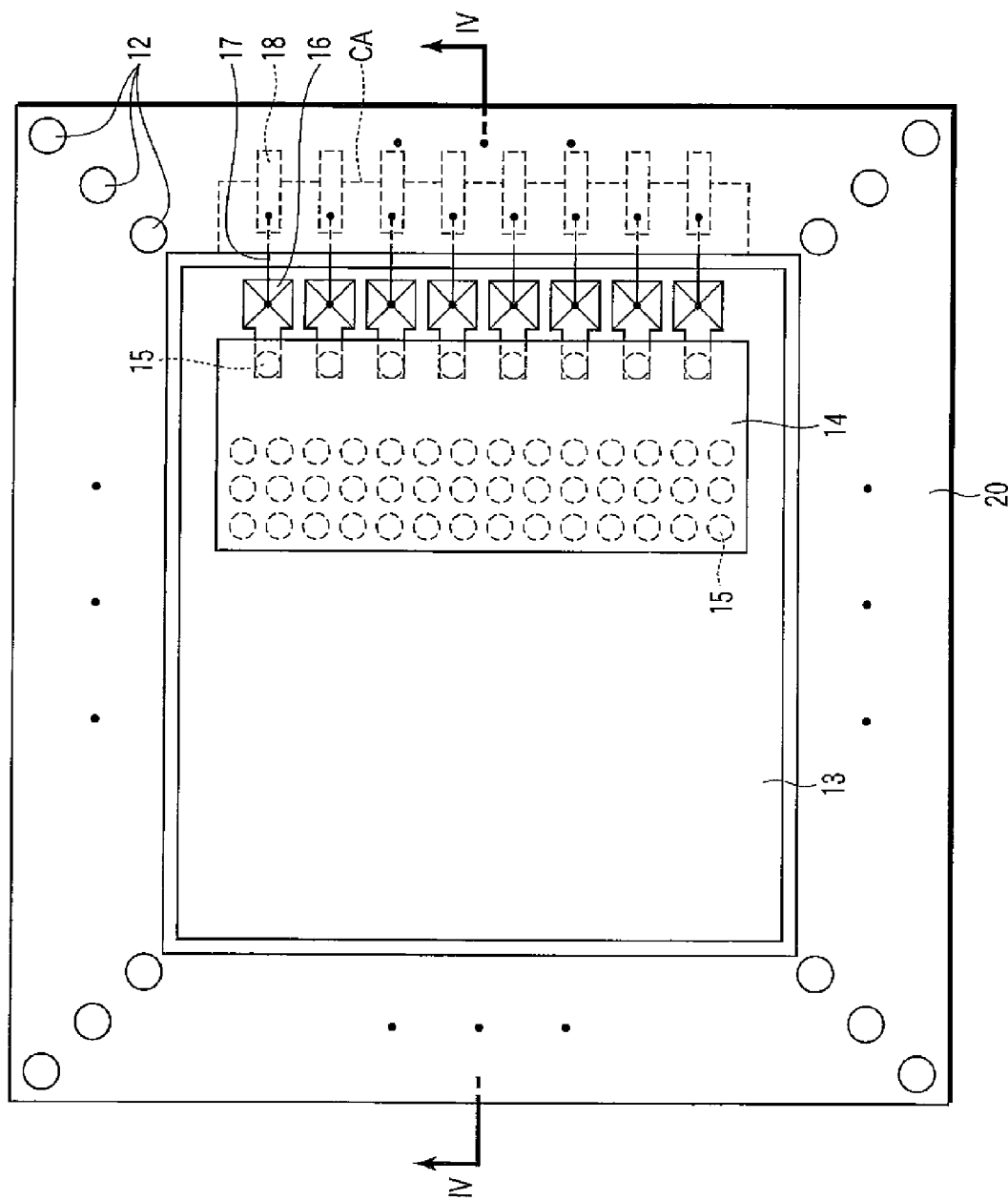
FIG. 3 is a plan view illustrating a modified example of the first example.

FIG. 3 illustrates a system in package device according to a modified example of the first example. FIG. 4 is a cross-sectional view taken along a line IV-IV of FIG. 3.

The feature of this modified example is that the external terminals 12 of the array pattern are arranged on the other face side of the package substrate 11. Accordingly, the constitution in FIGS. 1 and 2 is partially changed.

A heat spreader 31 is arranged on one face side of the package substrate 11. This modified example has an advantage that the large heat spreader 31 can be arranged on one face side of the package substrate 11.

A convex portion (package substrate) 20 is arranged along an edge of the other face side of the package substrate 11. The convex portion 20 is jointed to the package substrate 11 by adhesive.

The external terminals 12 of the array pattern are arranged on the convex portion 20.

The lower chip 13 is arranged on a center of the other face side of the package substrate 11. The rear face of the lower chip 13 is jointed to the other face of the package substrate 11 by adhesive.

The upper chip 14 is arranged on the lower chip 13. The upper chip 14 is a chip which has a function different from that of the lower chip 13.

The bumps 15 of the array pattern are arranged between the lower chip 13 and the upper chip 14.

Since the upper chip 14 is flip-chip bonded to the lower chip 13, similarly to the constitution in FIGS. 1 and 2, the front face of the lower chip 13 is opposed to the front face of the upper chip 14.

Since the size of the upper chip 14 is smaller than the size of the lower chip 13, the front face of the upper chip 14 is completely hidden when viewed from above the package substrate 11.

Similarly to the constitution in FIGS. 1 and 2, a signal to be input into the external terminal 12 is input into the lower chip 13 via the upper chip 14. The signal is transmitted to the external terminal 12 from the lower chip 13 via the upper chip 14 so as to be output to the outside of the package.

That is, the lower chip 13 has the conductive layers 16 as the leads to the upper chip 14. The package substrate 11 has the conductive layers 18, and the bonding wires 17 connect the conductive layers 16 and 18, respectively. The convex portion 20 has the conductive line 19 which connects one of the external terminals 12 to the conductive layer 18.

As a result, the external terminal 12 as the signal terminal is connected to the upper chip 14 via the bump 15, the conductive layer 16, the bonding wire 17, the conductive layer 18 and the conductive line 19.

Since a cavity CA is provided on a part of the convex portion 20, the conductive layers 16 and 18 can be jointed to each other by the bonding wires 17.

C. Summary

According to the first example, since the lower chip has the conductive layer as the lead to the upper chip, the performance of the system in package device can be heightened.

(2) Second Example

A. Constitution

Figure 5:
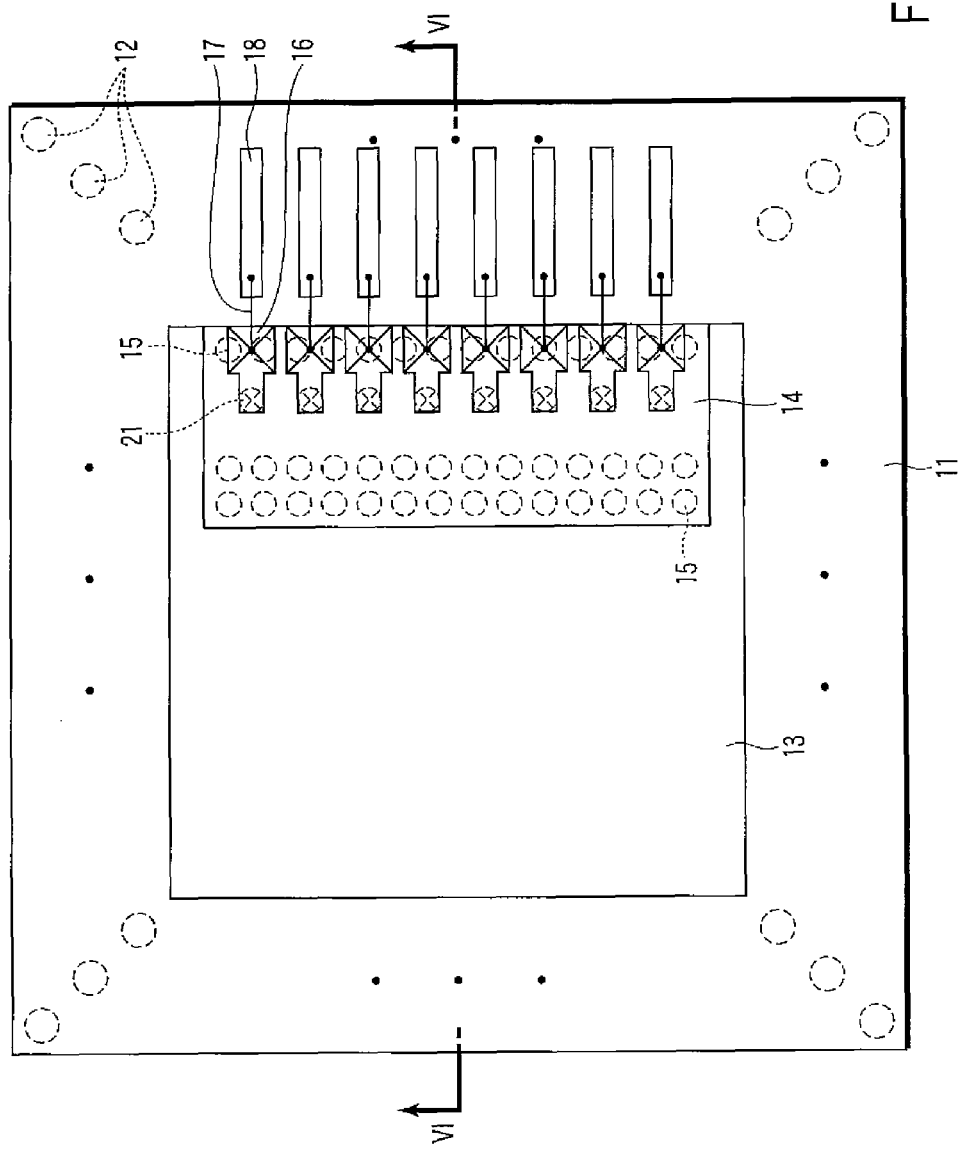
FIG. 5 is a plan view illustrating the first SIP according to a second example.
Figure 6:
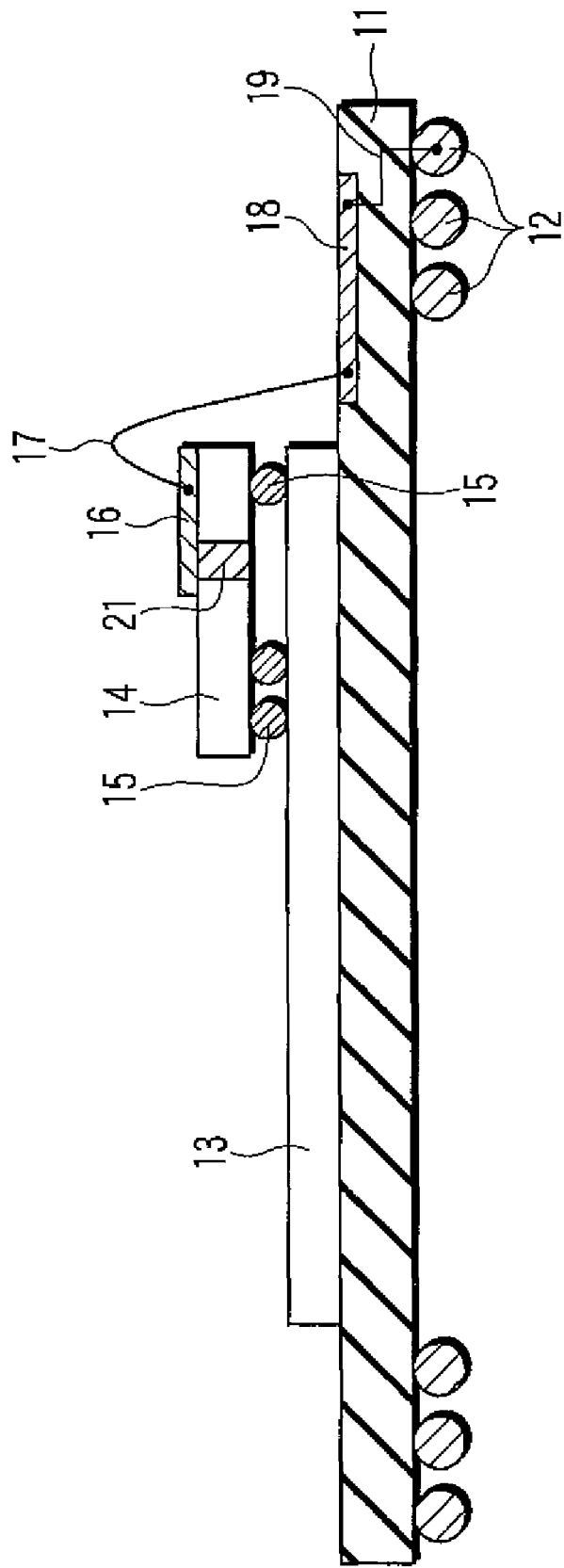
FIG. 6 is a cross-sectional view taken along a line VI-VI of FIG. 5.

FIG. 5 illustrates a system in package device according to a second example. FIG. 6 is a cross-sectional view taken along a line VI-VI of FIG. 5.

The external terminals 12 of the array pattern are arranged on one face side of the package substrate 11. In this example, the external terminals 12 are bumps, but the external terminals are not limited to them and thus may be pins, pads or the like.

The lower chip 13 is arranged on the other face side of the package substrate 11. The lower chip 13 is, for example, a logic chip. The rear face of the lower chip 13 is jointed to the other face of the package substrate 11 by adhesive.

The upper chip 14 is arranged on the lower chip 13. The upper chip 14 is a chip having a function different from that of the lower chip 13, such as an interface chip.

Bumps of an array pattern (for example, micro-bumps having diameter of 100 μm or less) 15 are arranged between the lower chip 13 and the upper chip 14.

Since the upper chip 14 is flip-chip bonded to the lower chip 13, the front face of the lower chip 13 is opposed to the front face of the upper chip 14.

Since the size of the upper chip 14 is smaller than that of the lower chip 13, the front face of the upper chip 14 is completely hidden when viewed from above the package substrate 11.

In this example, a signal to be input into the external terminal 12 is input into the lower chip 13 via the upper chip 14. The signal is transmitted to the external terminal 12 from the lower chip 13 via the upper chip 14 so as to be output to the outside of the package.

That is, the upper chip 14 has through holes 21 which pierce the chip 14 and the conductive layers 16 which are arranged on the rear face of the chip 14. The package substrate 11 has the conductive layers 18, and the conductive line 19 which connects one of the external terminals 12 to the conductive layer 18. The bonding wire 17 connects the conductive layers 16 and 18.

As a result, the external terminal 12 as the signal terminal is connected to the upper chip 14 via the conductive layer 16, the bonding wire 17, the conductive layer 18, the conductive line 19 and the through hole 21.

B. Modified Example

Figure 7:
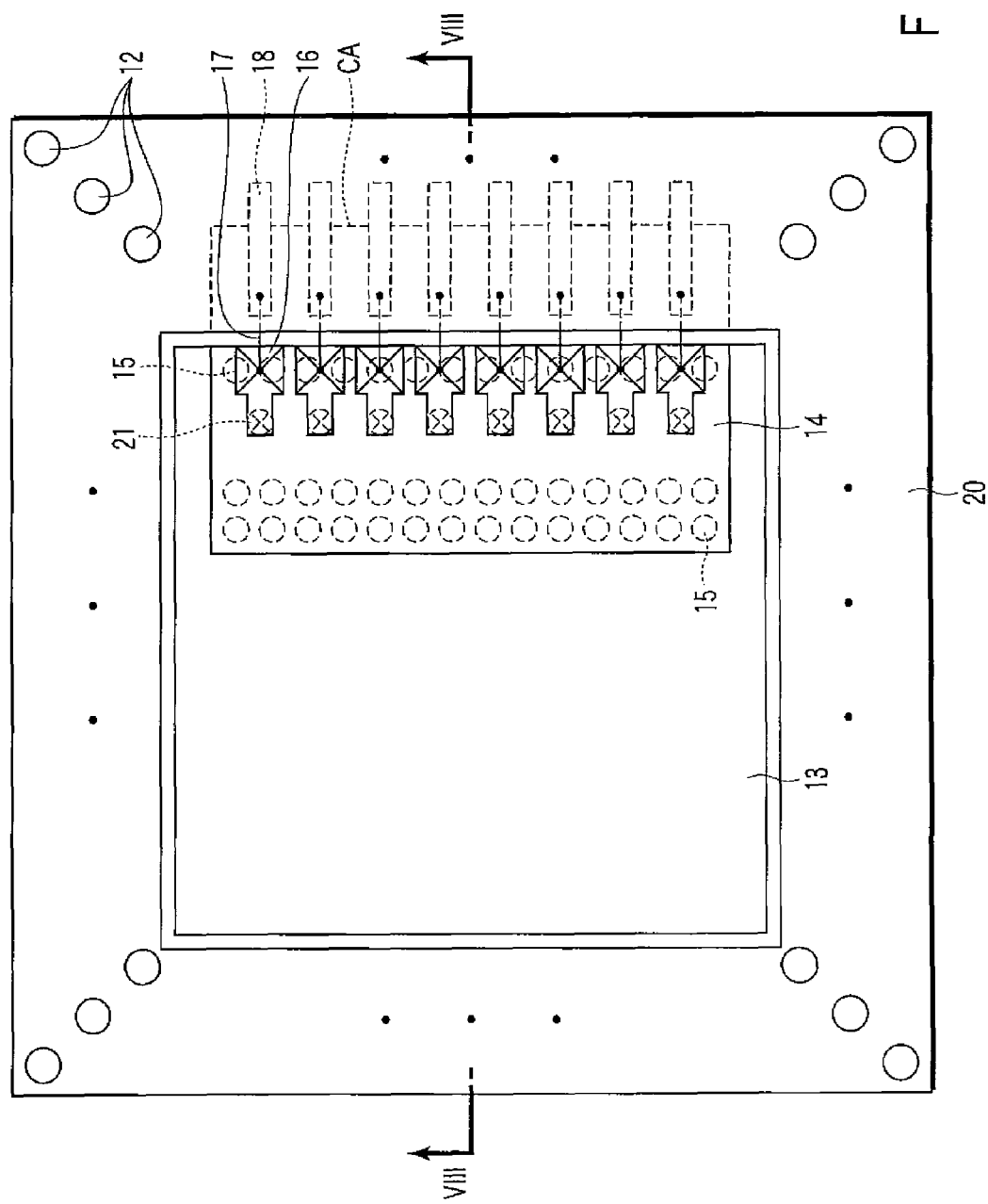
FIG. 7 is a plan view illustrating a modified example of the second example.
Figure 8:
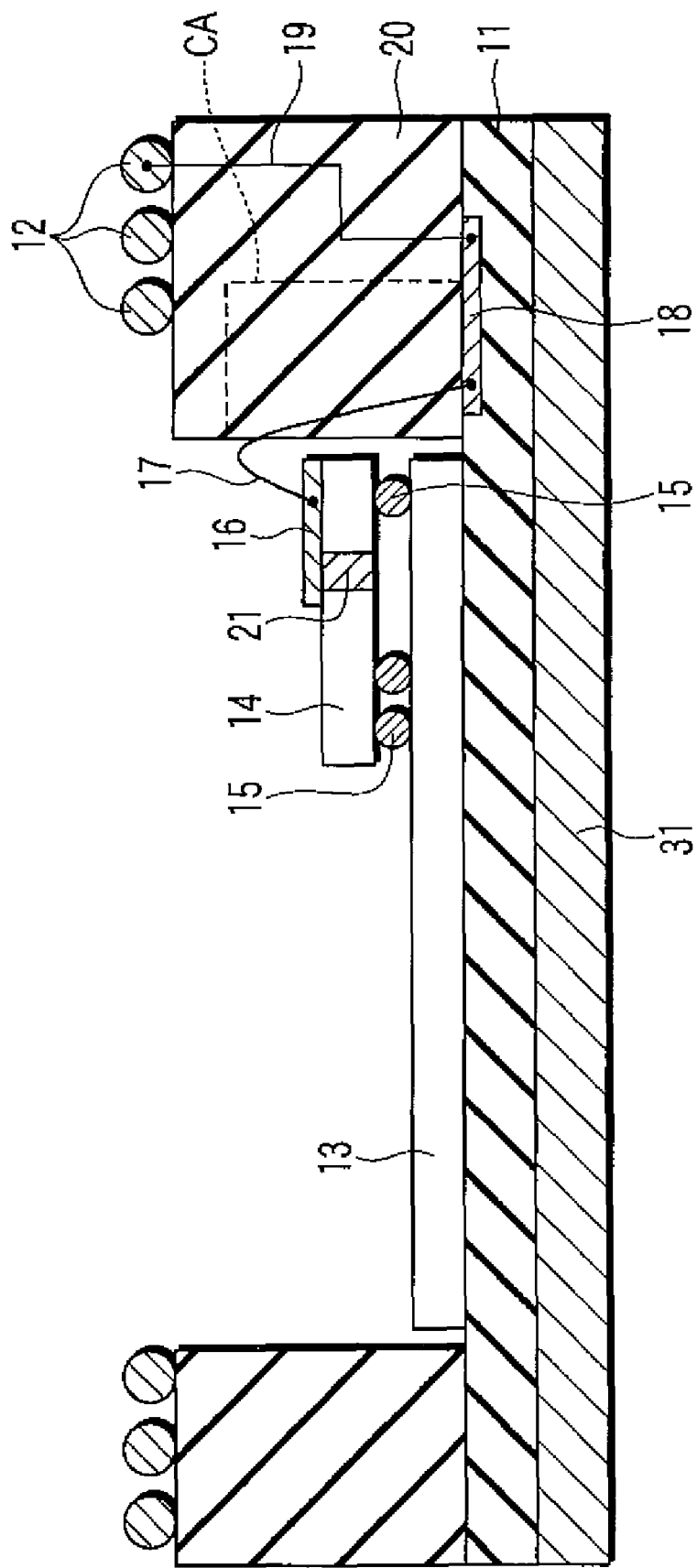
FIG. 8 is a cross-sectional view taken along a line VIII-VIII of FIG. 7.

FIG. 7 illustrates a system in package device according to a modified example of the second example. FIG. 8 is a cross-sectional view taken along a line VIII-VIII of FIG. 7.

The feature of this modified example is that the external terminals 12 of the array pattern are arranged on the other face side of the package substrate 11. Accordingly, the constitution in FIGS. 5 and 6 is partially changed.

The heat spreader 31 is arranged on one face side of the package substrate 11. This modified example has an advantage that the large heat spreader 31 can be arranged on one side face of the package substrate 11.

The convex portion (package substrate) 20 is arranged along the edge of the other face side of the package substrate 11. The convex portion 20 is jointed to the package substrate 11 by adhesive.

The external terminals 12 of the array pattern are arranged on the convex portion 20.

The lower chip 13 is arranged on the center of the other face side of the package substrate 11. The rear face of the lower chip 13 is jointed to the other face of the package substrate 11 by adhesive.

The upper chip 14 is arranged on the lower chip 13. The upper chip 14 is a chip which has a function different from that of the lower chip 13.

The bumps 15 of the array pattern are arranged between the lower chip 13 and the upper chip 14.

Since the upper chip 14 is flip-chip bonded to the lower chip 13, the front face of the lower chip 13 is opposed to the front face of the upper chip 14 similarly to the constitution in FIGS. 5 and 6.

Since the size of the upper chip 14 is smaller than the size of the lower chip 13, the face of the upper chip 14 is completely hidden when viewed from above the package substrate 11.

Similarly to the constitution in FIGS. 5 and 6, the signal to be input into the external terminal 12 is input into the lower chip 13 via the upper chip 14. The signal is transmitted to the external terminals 12 from the lower chip 13 via the upper chip 14 so as to be output to the outside of the package.

That is, the upper chip 14 has the through holes 21 which pierce the chip 14, and the conductive layers 16 which are arranged on the rear face of the chip. The package substrate 11 has the conductive layers is, and the bonding wires 17 connect the conductive layers 16 and 18. The convex portion 20 has the conductive line 19 which connects one of the external terminals 12 to the conductive layer 18.

As a result, the external terminal 12 as the signal terminal is connected to the upper chip 14 via the conductive layer 16, the bonding wire 17, the conductive layer 18, the conductive line 19 and the through hole 21.

Since the cavity CA is provided on a part of the convex portion 20, the conductive layers 16 and 18 can be jointed by the bonding wire 17.

C. Summary

According to the second example, since the upper chip has the through holes which pierce the chip and the conductive layers arranged on the rear face of the chip, the performance of the system in package device can be heightened.

In case of the second example is compared with the first example, the cost increases due to the provision of the through holes. The conductive layers as the leads to the upper chip do not have to be provided on the lower chip. For this reason, the second example has an advantage that the size of the lower chip can be reduced.

(3) Third Example

A. Constitution

Figure 9:
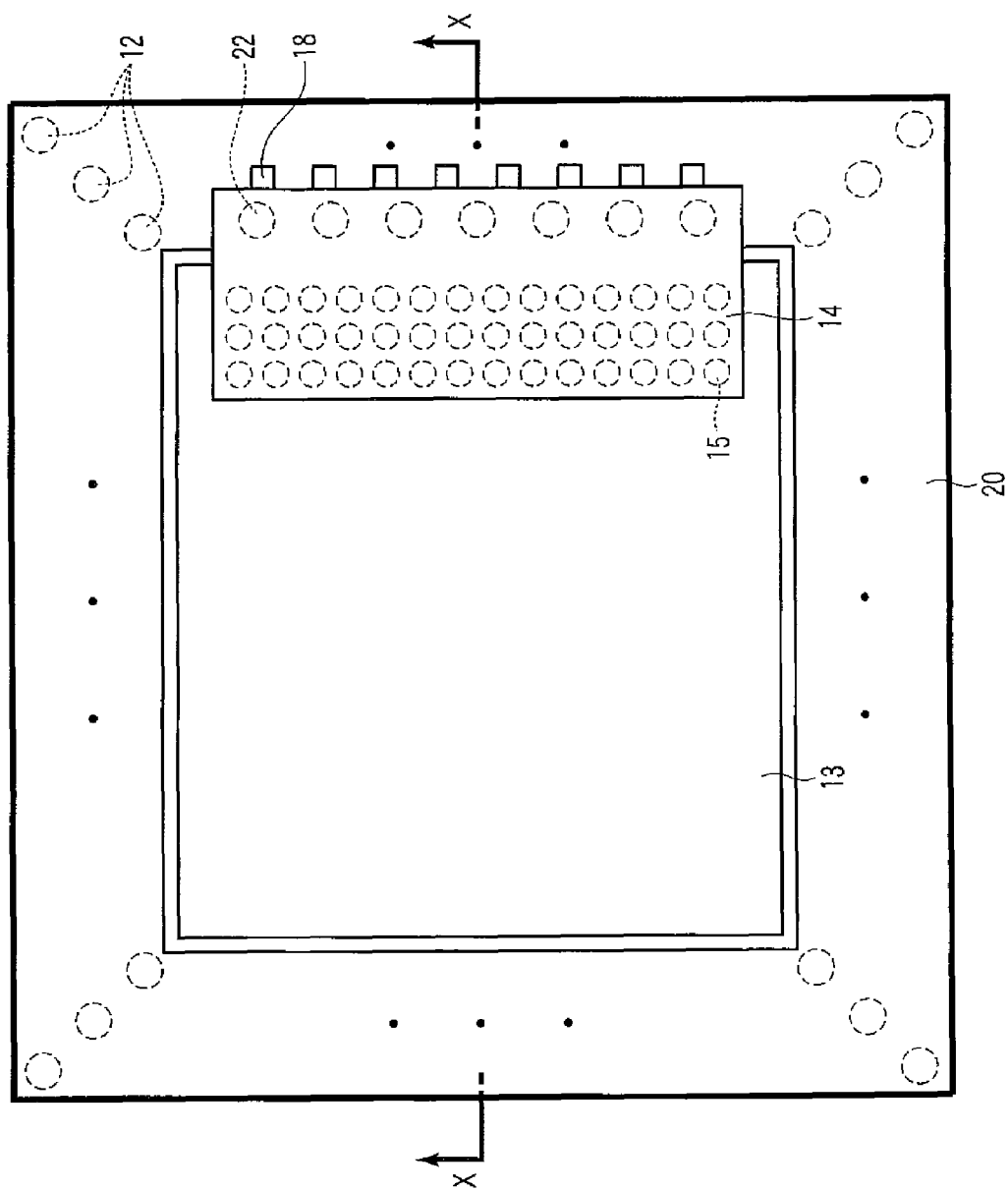
FIG. 9 is a plan view illustrating the first SIP according to a third example.
Figure 10:
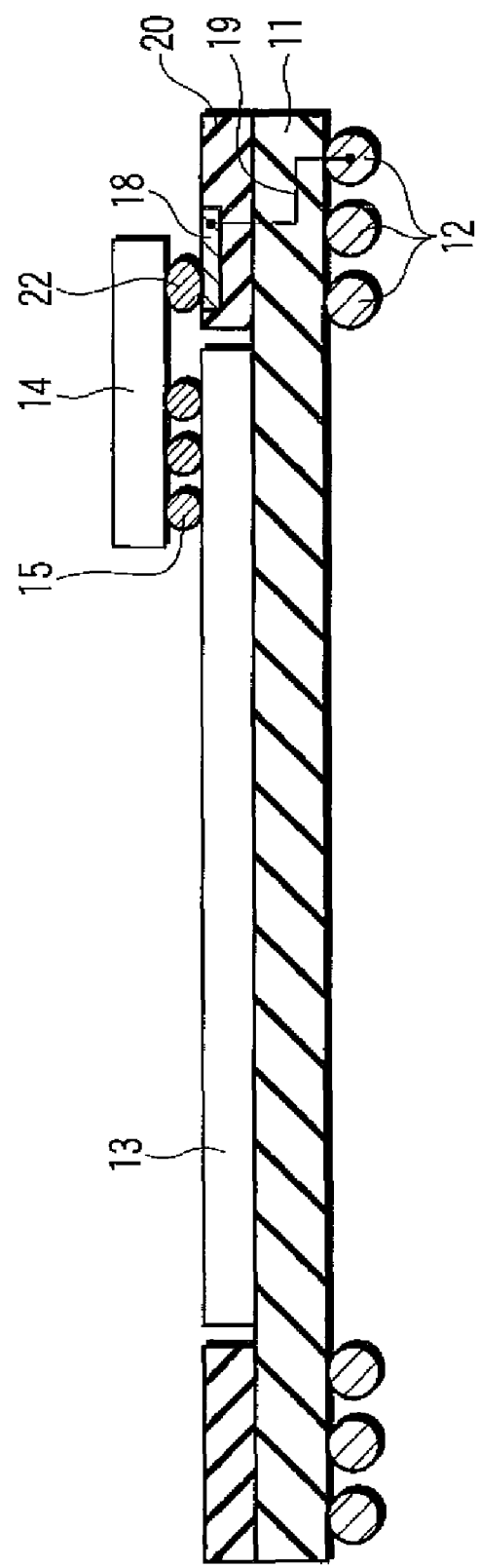
FIG. 10 is a cross-sectional view taken along a line X-X of FIG. 9.

FIG. 9 illustrates a system in package device according to a third example. FIG. 10 is a cross-sectional view taken along a line X-X of FIG. 9.

The external terminals 12 of the array pattern are arranged on one face side of the package substrate 11. In this example, the external terminals 12 are bumps, but the external terminals are not limited to them and thus may be pins, pads or the like.

The convex portion (package substrate) 20 is arranged along the edge of the other end face of the package substrate 11. The convex portion 20 is jointed to the package substrate 11 by adhesive.

The convex portion 20 can be provided also by providing a concave portion on the center of the package substrate 11.

The lower chip 13 is arranged on the center of the other face side of the package substrate 11. The lower chip 13 is, for example, a logic chip. The rear face of the lower chip 13 is bonded to the other face of the package substrate 11 by adhesive.

The upper face of the lower chip 13 approximately matches with the upper face of the convex portion 20.

The upper chip 14 is arranged to straddle the lower chip 13 and the convex portion 20. The upper chip 14 is a chip having a function different from that of the lower chip 13, such as an interface chip.

Bumps of the array pattern (for example, micro-bumps having diameter of 100 μm or less) 15 are arranged between the lower chip 13 and the upper chip 14. Bumps of the array pattern (for example, normal flip-chip bumps having diameter of more than 100 μm) 22 are arranged between the convex portion 20 and the upper chip 14.

One of the external terminals 12 is a signal terminal.

In this example, the signal to be input into the signal terminal is input into the lower chip 13 via the upper chip 14. The signal is transmitted to the signal terminal from the lower chip 13 via the upper chip 14 so as to be output to the outside of the package.

That is, the convex portion 20 has the conductive layers 18, and one bump 22 as the signal terminal is connected to the conductive layer 18. The package substrate 11 and the convex portion 20 have the conductive line 19 which connects one of the external terminals 12 to the conductive layer 18.

As a result, the external terminal 12 as the signal terminal is connected to the upper chip 14 via the conductive layer 18, the conductive line 19 and the bump 22.

B. First Modified Example

Figure 11:
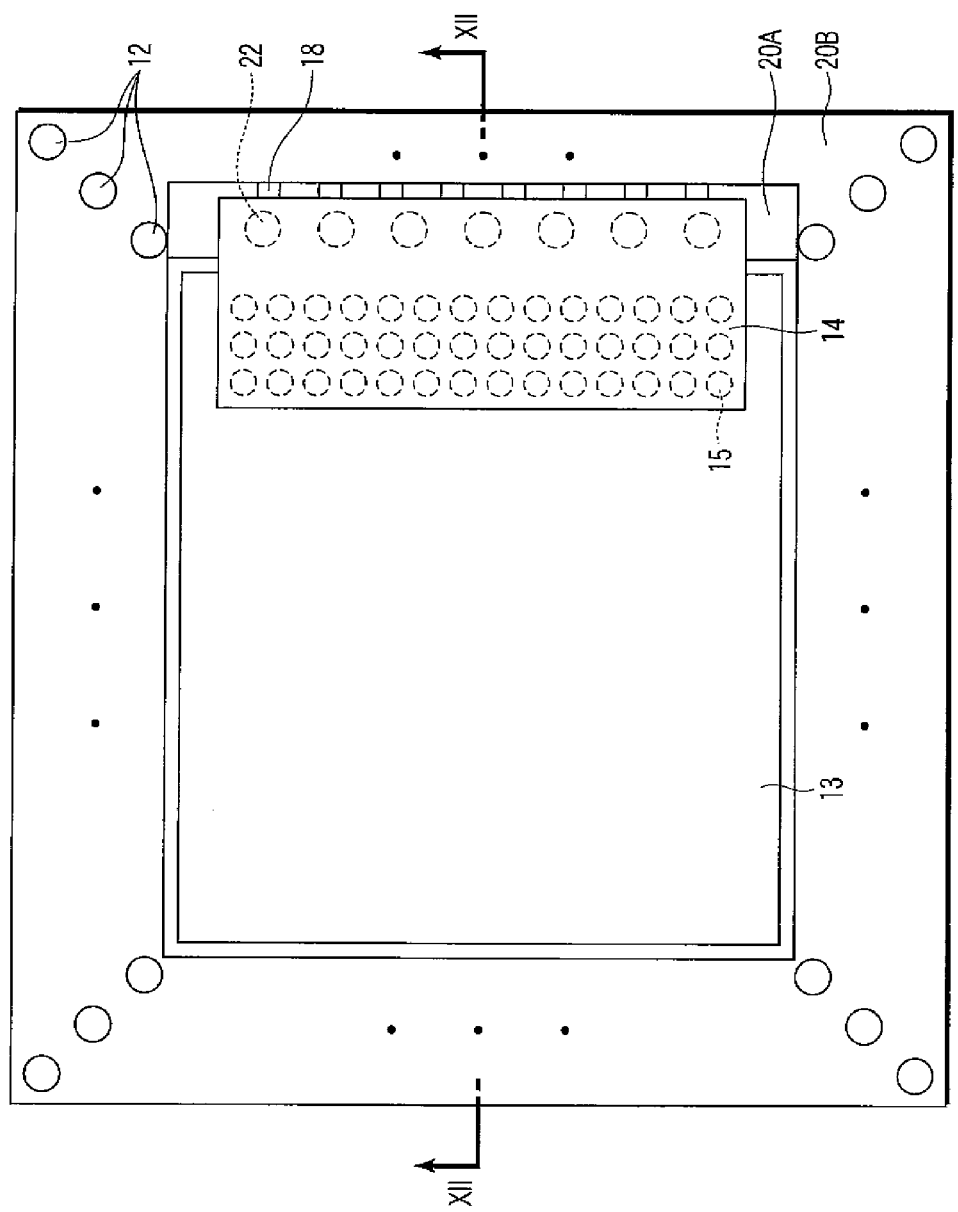
FIG. 11 is a plan view illustrating a first modified example of the third example.
Figure 12:
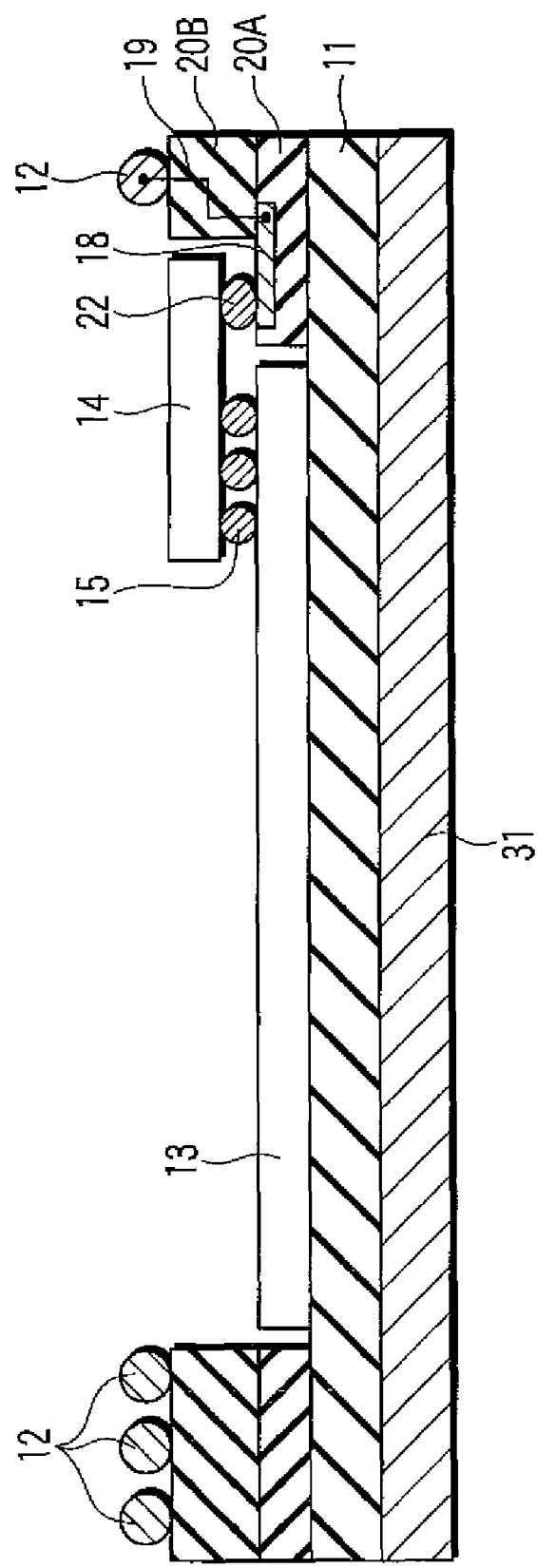
FIG. 12 is a cross-sectional view taken along a line XII-XII of FIG. 11.

FIG. 11 illustrates a system in package device according to a first modified example of the third example. FIG. 12 is a cross-sectional view taken along a line XII-XII of FIG. 11.

The feature of the first modified example is that the external terminals 12 of the array pattern are arranged on the other face side of the package substrate 11. Accordingly, the constitution in FIGS. 9 and 10 is partially changed.

The heat spreader 31 is arranged on one face side of the package substrate 11. The first modified example has an advantage that the large heat spreader 31 can be arranged on one face side of the package substrate 11.

Convex portions (package substrates) 20A and 20B are arranged along the edge of the other face side of the package substrate 11. The convex portions 20A and 208 are jointed to the package substrate 11 by adhesive.

The convex portion 20A can be formed also by providing a concave portion on the center of the package substrate 11.

The external terminals 12 of the array pattern are arranged on the convex portion 20B.

The lower chip 13 is arranged on the center of the other face side of the package substrate 11. The rear face of the lower chip 13 is jointed to the other face of the package substrate 11 by adhesive.

The upper chip 14 is arranged on the lower chip 13 and the convex portion 20A so as to straddle both of them. A part of the convex portion 20A is not covered with the convex portion 20B so that the upper chip 14 can be arranged. The upper face of the lower chip 13 is approximately on a level with the upper face of the convex portion 20A.

The upper chip 14 is a chip which has a function different from that of the lower chip 13.

The bumps 15 of the array pattern are arranged between the lower chip 13 and the upper chip 14. The bumps 22 of the array pattern are arranged between the convex portion 20A and the upper chip 14.

Similarly to the constitution in FIGS. 9 and 10, the signal to be input into the external terminal 12 is input into the lower chip 13 via the upper chip 14. The signal is transmitted to the external terminal 12 from the lower chip 13 via the upper chip 14 so as to be output to the outside of the package.

That is, the convex portion 20A has the conductive layers 18, and one bump 22 as the signal terminal is connected to the conductive layer 18. The convex portions 20A and 20B have the conductive line 19 which connects one of the external terminals 12 to the conductive layer 18.

As a result, the external terminal 12 as the signal terminal is connected to the upper chip 14 via the conductive layer 18, the conductive line 19 and the bump 22.

In the first modified example, the package substrate 11 can be omitted. In this case, the lower chip 13, and the convex portions (package substrate) 20A and 20B are mounted directly on the head spreader 31.

C. Second Modified Example

Figure 13:
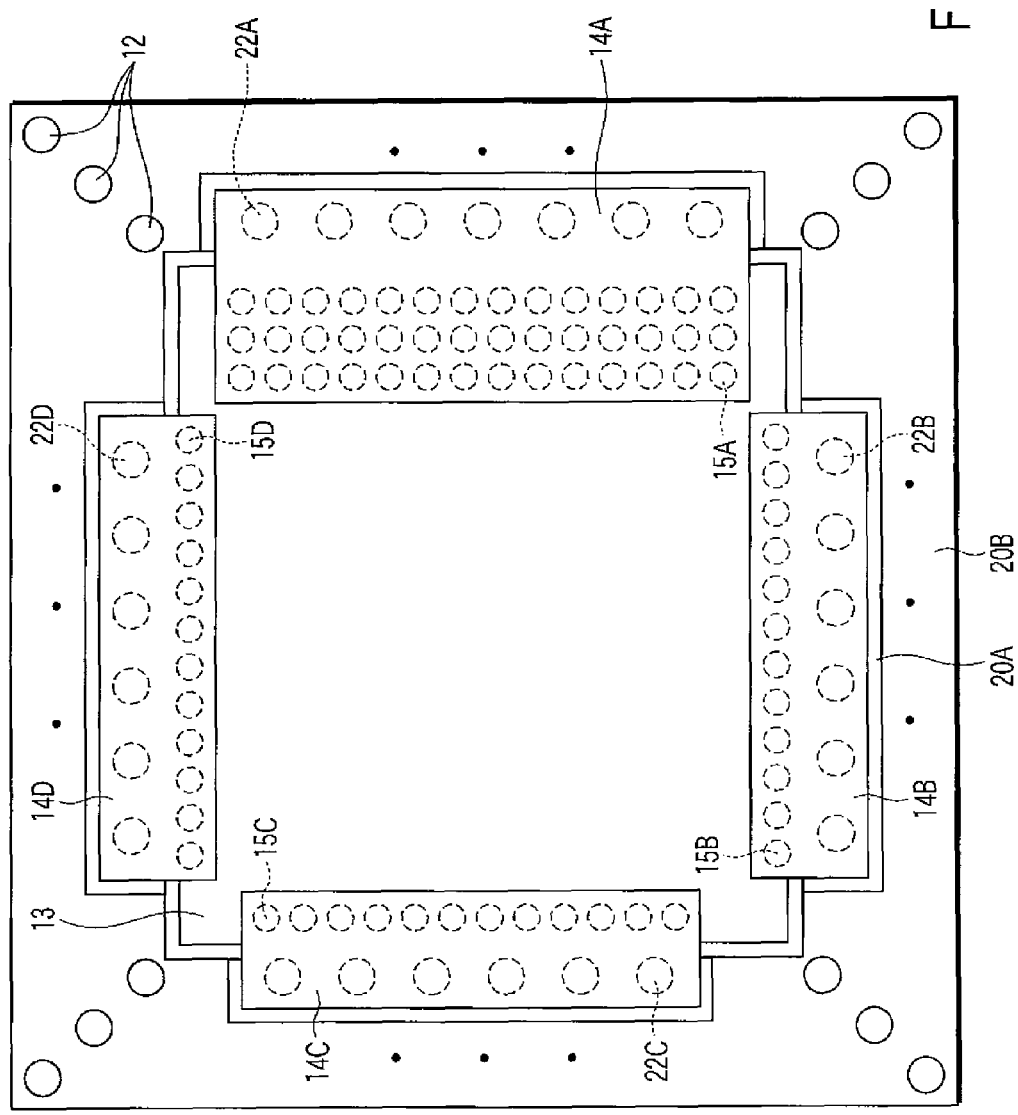
FIG. 13 is a plan view illustrating a second modified example of the third example.

FIG. 13 illustrates a system in package device according to a second modified example of the third example.

The feature of the second modified example is that upper chips 14A, 14H, 14C and 14D are arranged on the lower chip 13 and the convex portion 20, and the other parts of the constitution are the same as those of the constitution in FIGS. 9 and 10.

In this example, the four upper chips 14A, 14B, 14C and 14D are arranged in such a manner that each chip is arranged on each side of the lower chip 13, respectively. However, the number of the chips is not limited to that in this example, and thus any number is acceptable as long as it is two or more.

The upper chips 14A, 14B, 14C and 14D have the same feature as that of the upper chip 14 in the constitution of FIGS. 9 and 10.

That is, bumps 15A, 15B, 14C and 15D are arranged between the lower chip 13 and the upper chips 14A, 14B, 14C and 14D, respectively, and bumps 22A, 22B, 22C and 22D are arranged between the convex portion 20 and the upper chips 14A, 14B, 14C and 14D, respectively.

The signal to be input into the external terminal 12 is input into the lower chip 13 via one of the upper chips 14A, 14B, 14C and 14D. The signal is transmitted to the external terminal 12 from the lower chip 13 via one of the upper chips 14A, 14B, 14C and 14D so as to be output to the outside of the package.

The functions of the upper chips 14A, 14B, 14C and 14D may be the same as one another or may be varied from one another.

For example, the upper chip 14A can be a high-speed interface chip, and the residual three upper chips 14B, 14C and 14D can be normal CMOS interface chips.

D. Summary

According to the third example, since the upper chips are arranged on the lower chip and the convex portion of the package substrate so as to straddle them, the performance of the system in package device can be heightened.

3. Application Example

The examples of the present invention can be applied to high-speed communication systems.

For example, when the lower chip in the first to third examples is the logic chip and the upper chip is the interface chip, the signal is input/output to/from the logic chip via the interface chip, thereby enabling high-speed communication.

Examples of the interface chip include SerDes (serializer/deserializer) I/O chip.

In this case, for example, serial data is input into the upper chip from an external bus via the external terminal. The serial data is converted into parallel data in the upper chip, and the parallel data is output to the lower chip.

For example, the parallel data is input from the lower chip into the upper chip. The parallel data is converted into serial data in the upper chip, and the serial data is output to the external bus via the external terminal.

4. Conclusion

According to the present invention, the performance of the system in package device having the two chips stacked on each other via the bump can be heightened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

[B] Second System-in-Package Device

1. Outline

The present invention proposes a constitution in which two chips (first and second chips) arranged in parallel are connected to each other by a wiring chip (third chip).

Specifically, the wiring chip straddles the two chips and covers only some portions of front faces of the two chips. The two chips are connected to the wiring chip by a bump.

As a result, even if the number of terminals of the chips increases according to the heightening of the performance of the system, the connection between the two chips can be secured in the package. Since the wiring chip does not completely cover the front faces of the two chips, the connection of the two chips to the external terminals of the package can be secured.

Further, when the package substrate is arranged along the edge of one face side of the heat spreader and the two chips are arranged side by side on the center of the heat spreaders this constitution can contribute to improvement in a radiation property.

The front face of the chip is the face on which an element or a conductive layer is formed, and the rear face of the chip is the face on which neither an element nor a conductive layer is formed.

2. Examples

Some examples which seem to be the best will be described below.

(1) First Example

A. Constitution

Figure 14:
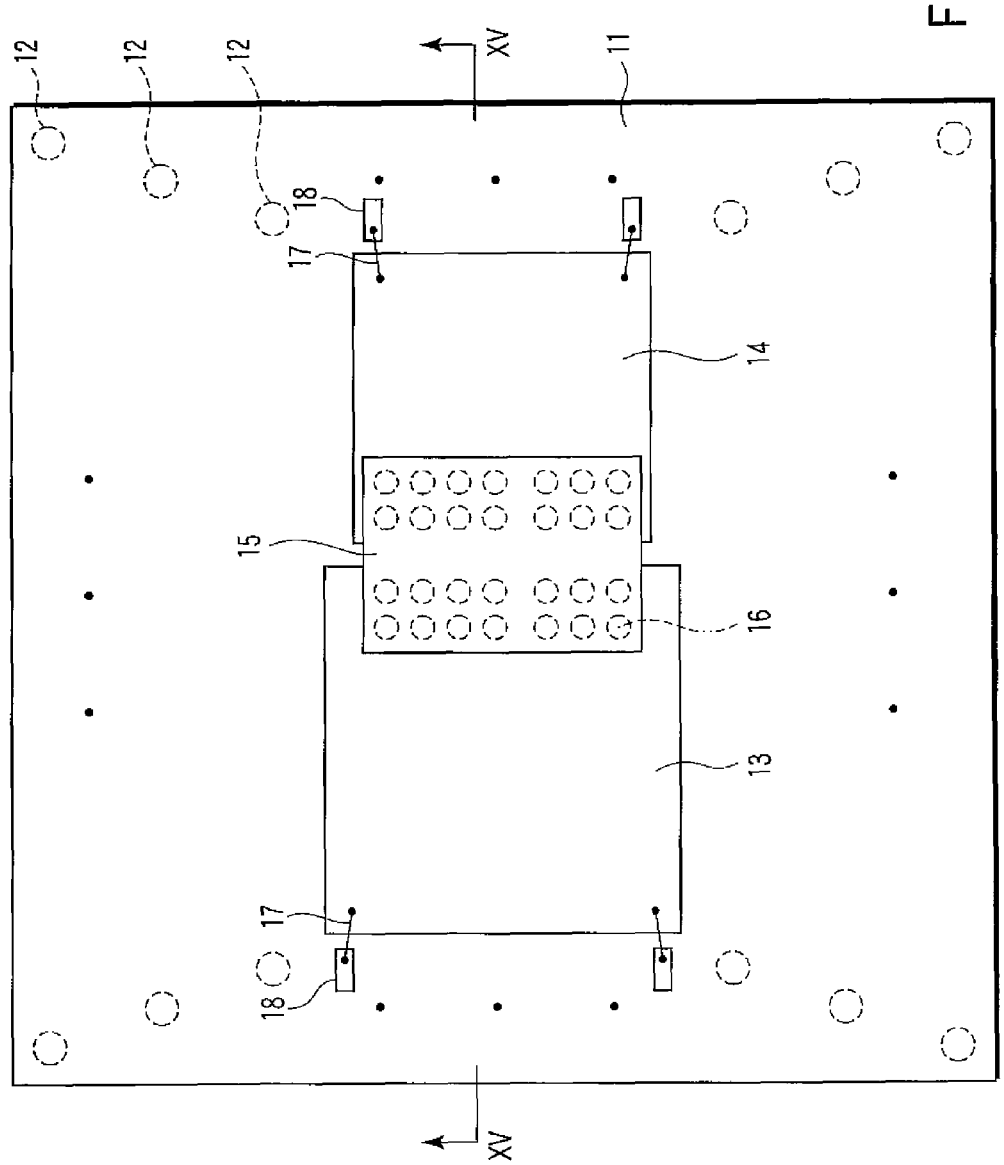
FIG. 14 is a plan view illustrating a second SIP according to a first example.

FIG. 14 illustrates a system in package device according to a first example. FIG. 15 is a cross-sectional view taken along a line XV-XV of FIG. 14.

The external terminals 12 of the array pattern are arranged on one face side of the package substrate 11. In this example, the external terminals 12 are bumps, but the external terminals are not limited to them and thus may be pins, pads or the like.

Two LSI chips 13 and 14 are arranged on the other face side of the package substrate 11 side by side. The LSI chip 13 is, for example, a logic chip, and the LSI chip 14 is, for example, a memory chip. The rear faces of the LSI chips 13 and 14 are jointed to the other face of the package substrate 11 by adhesive.

A wiring chip 15 is arranged on the LSI chips 13 and 14 so as to straddle them. The wiring chip 15 has a conductive layer which connects the LSI chips 13 and 14.

As a result, the LSI chips 13 and 14 transmit and receive a signal via the wiring chip 15. The wiring chip 15 has only the conductive layer which connects the LSI chips 13 and 14, for example.

The wiring chip 15 covers only some portions on the front faces of the LSI chips 13 and 14. In order to realize this constitution, for example, an area of the front face of the wiring chip 15 may be made to be smaller than a total area of the front faces of the LSI chips 13 and 14.

As a result, the connection between the LSI chips 13 and 14 and the external terminals 12 is secured. That is, the LSI chips 13 and 14 are connected to the external terminals 12 via the bonding wires 17, the conductive layers 18 and the conductive lines 19.

The bumps of the array pattern (for example, micro-bumps having diameter of 100 μm or less) 16 are arranged between the LSI chips 13 and 14 and the wiring chip 15.

Since the wiring chip 15 is flip-chip bonded to the LSI chips 13 and 14, the front faces of the LSI chips 13 and 14 are opposed to the front face of the wiring chip 15.

As a result, even if the number of the terminals of the chips increases according to the heightening of the performance of the system, the connection of the LSI chips 13 and 14 in the package can be secured.

B. Modified Example

FIG. 16 illustrates a system in package device according to a modified example of the first example. Since a plan view of the system in package device in FIG. 16 is the same as FIG. 14, it is omitted.

The feature of this modified example is that an LSI chip (bus bridge) 21 having a bus and a bus controller is used instead of the wiring chip 15 in FIGS. 14 and 15. The other parts are the same as those in FIGS. 14 and 15.

The LSI chip 21 is arranged on the LSI chips 13 and 14 so as to straddle them. The LSI chip 21 has a bus which connects the LSI chips 13 and 14, and the bus controller which controls the connection between the LSI chips 13 and 14.

The LSI chip 21 covers only some portions of the front faces of the LSI chips 13 and 14. In order to realize this constitution, for example, an area of the front face of the LSI chip 21 may be made to be smaller than a total area of the front faces of the LSI chips 13 and 14.

C. Summary

According to the first example, the constitution which can cope with the increase in the number of the terminals of the chips can be realized in the parallel type system in package device.

(2) Second Example

A. Constitution

Figure 17:
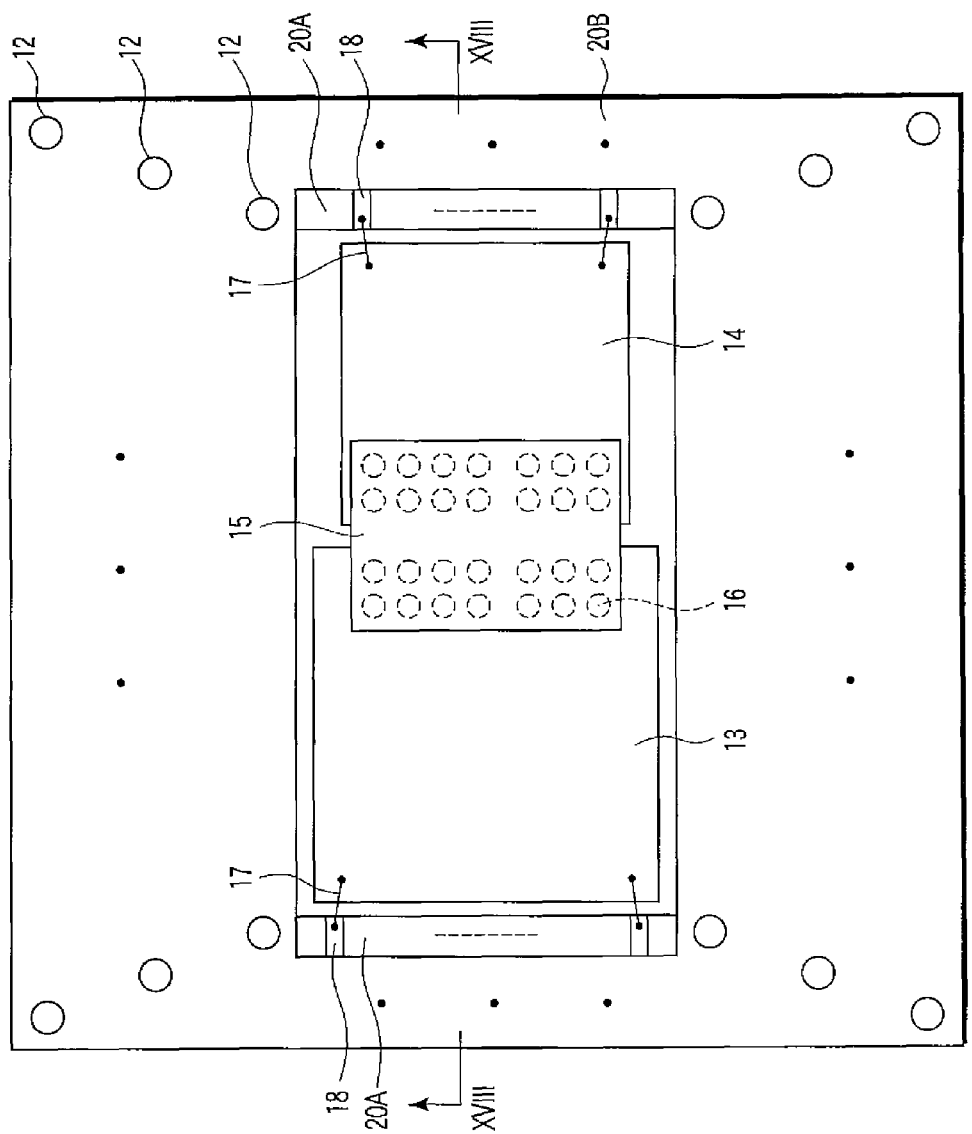
FIG. 17 is a plan view illustrating the second SIP according to a second example.
Figure 18:
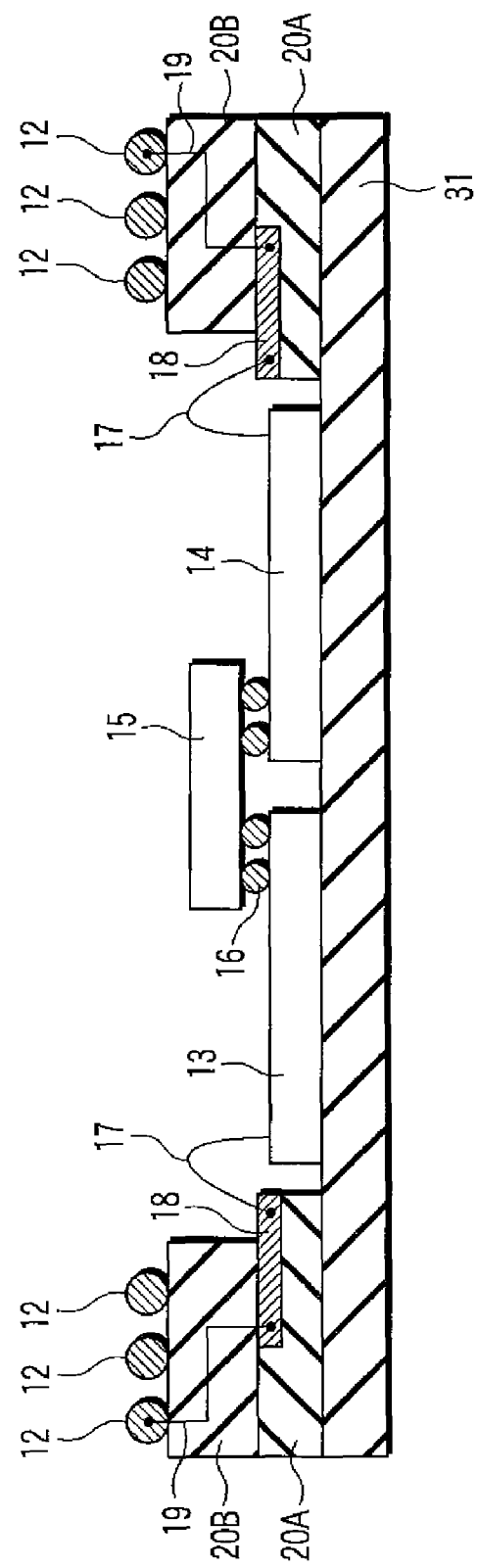
FIG. 18 is a cross-sectional view taken along a line XVIII-XVIII of FIG. 17.

FIG. 17 illustrates a system in package device according to a second example. FIG. 18 is a cross-sectional view taken along a line XVIII-XVIII of FIG. 17.

The package substrates 20A and 20B are arranged along the edge of one face side of the heat spreader 31. The external terminals 12 of the array pattern are arranged on the package substrate 20B. In this example, the external terminals 12 are humps, but the external terminals are not limited to them and thus may be pins, pads or the like.

The size of the package substrate 20B is smaller than the size of the substrate package 20A, and the package substrate 20A is partially exposed when viewed from above the heat spreader 31. The exposed portions become bonding portions.

The conductive layers 18 are arranged on the bonding portions, and the conductive layers 18 are connected to the external terminals 12 via the conductive lines 19, respectively.

The LSI chips 13 and 14 are arranged side by side on the center of one face side of the heat spreader 31. The LSI chip 13 is, for example, a logic chip, and the LSI chip 14 is, for example, a memory chip. The rear faces of the LSI chips 13 and 14 are jointed to the other face of the package substrate 11 by adhesive.

The wiring chip 15 is arranged on the LSI chips 13 and 14 so as to straddle them. The wiring chip 15 has a conductive layer which connects the LSI chips 13 and 14.

As a result, the LSI chips 13 and 14 transmit and receive a signal via the wiring chip 15. The wiring chip 15 has only the conductive layer which connects the LSI chips 13 and 14.

The wiring chip 15 covers only some portions on the front faces of the LSI chips 13 and 14. In order to realize this constitution, for example, the area of the front face of the wiring chip 15 may be made to be smaller than the total area of the front faces of the LSI chips 13 and 14.

As a result, the connection between the LSI chips 13 and 14, and the external terminals 12 of the package is secured. That is, the LSI chips 13 and 14 are connected to the external terminals 12 via the bonding wires 17, the conductive layers 18 and the conductive lines 19.

The bumps (for example, micro-bumps having diameter of 100 μm or less) 16 are arranged between the LSI chips 13 and 14 and the wiring chip 15.

Since the wiring chip 15 is flip-chip bonded to the LSI chips 13 and 14, the front faces of the LSI chips 13 and 14 are opposed to the front face of the wiring chip 15.

As a result, even if the number of the terminals of the chips increases according to the heightening of the performance of the system, the connection of the LSI chips 13 and 14 can be secured in the package.

Further, the heat spreader 31 can be brought into direct contact with the LSI chips 13 and 14, thereby contributing to improvement in the radiation property.

B. Modified Example

Figure 19:
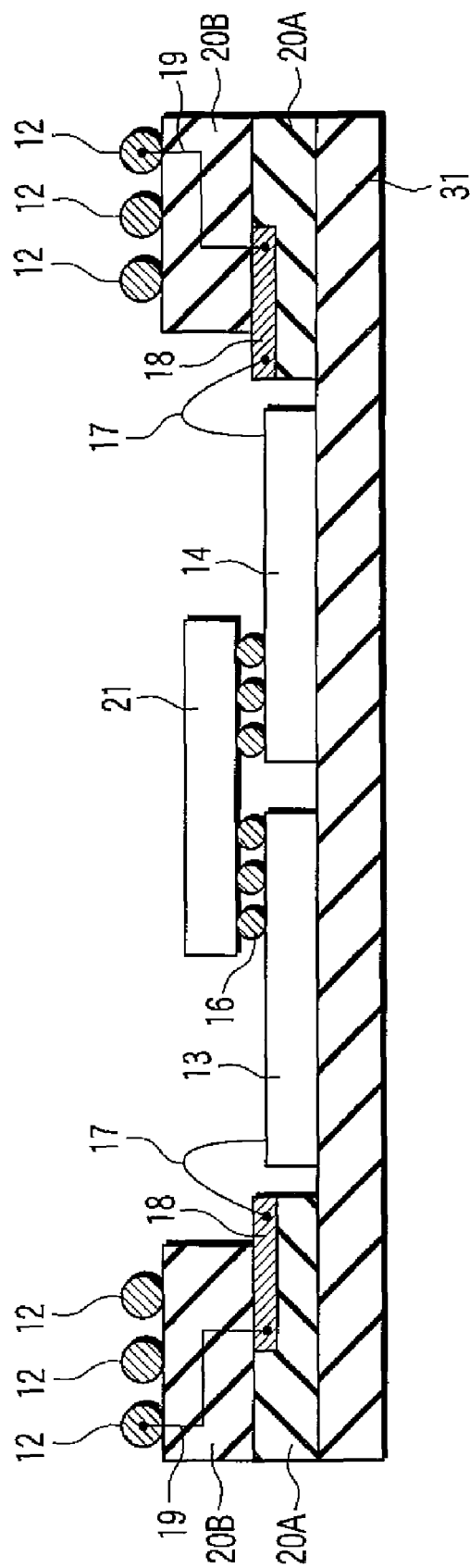
FIG. 19 is a plan view illustrating a modified example of the second example.

FIG. 19 illustrates a system in package device according to a modified example of the second example. Since a plan view of the system in package device in FIG. 19 is the same as that of FIG. 17, it is omitted.

The feature of the modified example is that the LSI chip (bus bridge) 21 having the bus and the bus controller is used instead of the wiring chip 15 in FIGS. 17 and 18. The other portions are the same as those in FIGS. 17 and 18.

The LSI chip 21 is arranged on the LSI chips 13 and 14 so as to straddle them. The LSI chip 21 has the bus which connects the LSI chips 13 and 14, and the bus controller which controls the connection of the LSI is chips 13 and 14.

The LSI chip 21 covers only some portions of the front faces of the LSI chips 13 and 14. In order to realize this constitution, for example, the area of the front face of the LSI chip 21 may be made to be smaller than the total area of the front faces of the LSI chips 13 and 14.

C. Summary

According to the second example, the constitution which can cope with the increase in the number of the terminals of the chips and the constitution having good radiation property can be realized simultaneously in the parallel type system in package device.

3. Application Example

The examples of the present invention can be applied to memory systems.

For example, when the LSI chip 13 in FIGS. 14 to 19 is a logic chip, and the LSI chip 14 is a memory chip, electronic devices such as PDA (personal digital assistance) which are mounted with the system in package device according to the examples of the present invention can be manufactured. In this case, a microcomputer chip may be mounted into the package.

The examples of the present invention can be applied to logic systems.

For example, an interface circuit is formed in the wiring chip 15 or the LSI chip 21 of FIGS. 14 to 19. In this case, a signal is input/output into/from the LSI chips 13 and 14 via the interface circuit in the wiring chip 15 or the LSI chip 21.

Figure 20:
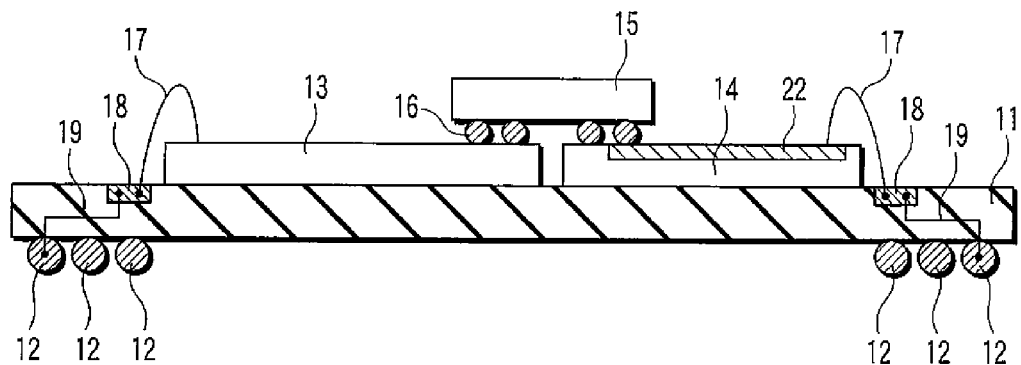
FIG. 20 is a cross-sectional view illustrating an applied example of the second SIP.
Figure 21:
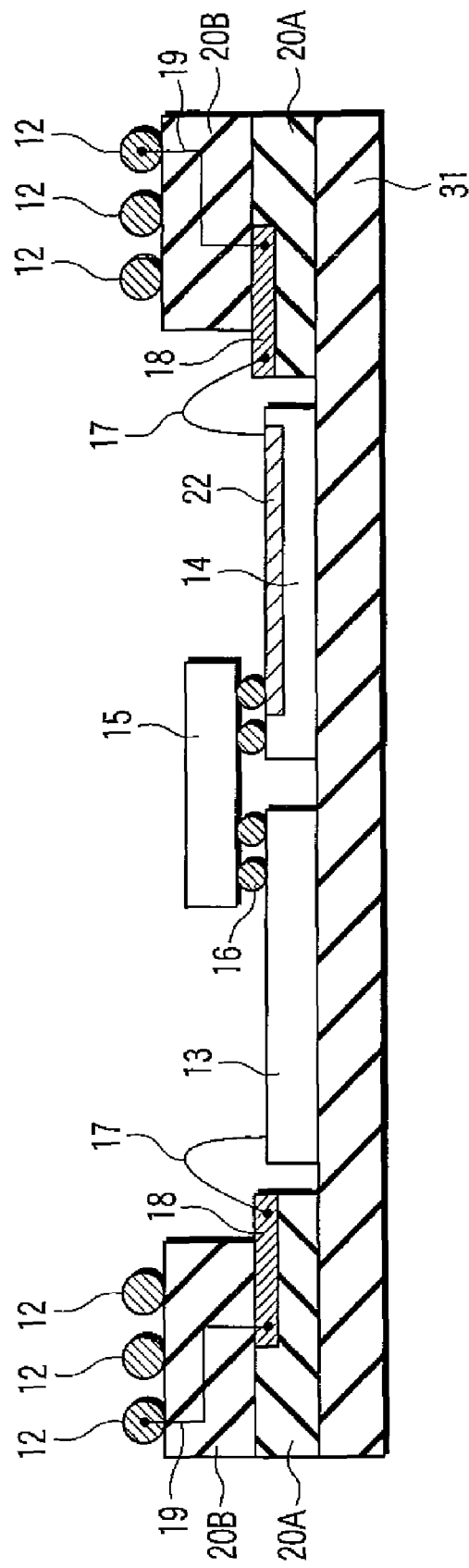
FIG. 21 is a cross-sectional view illustrating an applied example of the second SIP.

For example, in the case of the constitution shown in FIGS. 20 and 21, the LSI chip (logic chip) 13 is connected to one of the external terminals 12 via the interface circuit in the wiring chip 15, the conductive line 22 in the LSI chip 14, the bonding wire 17, the conductive layer 18 and the conductive line 19.

Figure 22:
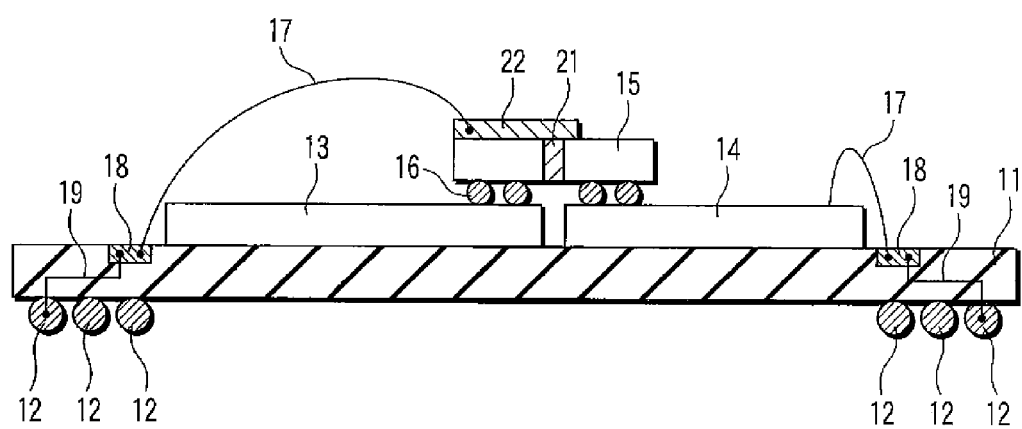
FIG. 22 is a cross-sectional view illustrating an applied example of the second SIP.
Figure 23:
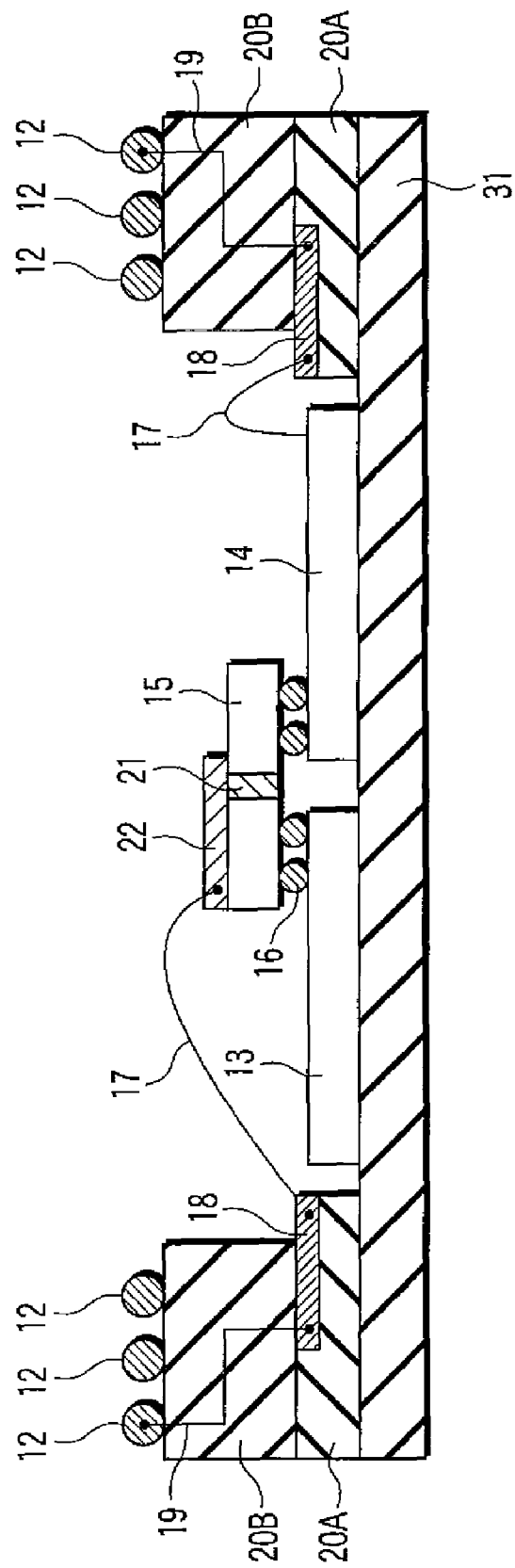
FIG. 23 is a cross-sectional view illustrating an applied example of the second SIP.

In the case of the constitution shown in FIGS. 22 and 23, the LSI chip (logic chip) 13 is connected to one of the external terminals 12 via the interface circuit in the wiring chip 15, the through hole 21 in the wiring chip 15, the conductive layer 22 on the rear face of the wiring chip 15, the bonding wire 17, the conductive layer 18 and the conductive line 19.

4. Conclusion

According to the present invention, in the parallel type system in package device, the constitution which can cope with the increase in the number of the terminals of the chips and the structure having the excellent radiation property can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A system in package device comprising:
a package substrate;
an external signal terminal arranged on a first face side of the package substrate, wherein the second face side is opposite the first face side;
a logic chip arranged on the second face side of the package substrate;
an interface chip arranged on the logic chip so the logic chip is between the interface chip and the second face side of the package substrate; and
bumps arranged between the logic chip and the interface chip,
wherein an input signal is transferred from the external signal terminal to a logic area on the logic chip through the interface chip, wherein the input signal is first transferred from the external signal terminal to the interface chip and then transferred from the interface chip to the logic area of the logic chip via one or more of the bumps.

2. The system in package device of claim 1, wherein the interface chip is smaller than the logic chip.

3. The system in package device of claim 1, wherein an output signal is transferred from the logic chip to the external signal terminal through the interface chip, wherein the output signal is first transferred from the logic chip to the interface chip via one or more of the bumps and then transferred from the interface chip to the external signal terminal.

4. The system in package device of claim 1, wherein the interface chip is flip-chip bonded to the logic chip.

5. The system in package device of claim 1, wherein the input signal is transferred from the external signal terminal to the interface chip via a bonding wire.

6. The system in package device of claim 1, wherein the logic chip has a first conductive layer on a surface of the logic chip where the interface chip is arranged, wherein the input signal is transferred from the external signal terminal to the logic chip via the first conductive layer of the logic chip.

7. The system in package device of claim 6, wherein the first conductive layer of the logic chip is connected to at least one of the bumps.

8. The system in package device of claim 7, wherein the first conductive layer of the logic chip is connected to the bump arranged on an edge of the interface chip.

9. The system in package device of claim 8, wherein the first conductive layer of the logic chip is connected to a bonding wire, wherein the bonding wire is connected to the external signal terminal.

10. The system in package device of claim 9, wherein the input signal is transferred from the external signal terminal to a second conductive layer on the second face side of the package substrate and from the second conductive layer to the first conductive layer of the logic chip via the bonding wire.

11. The system in package device of claim 10, wherein the external signal terminal is connected to the second conductive layer via a conductive line implemented in the substrate.

12. The system in package device of claim 11, wherein the second conductive layer is one of a plurality of second conductive layers arranged along an edge of the second face side of the package substrate.

13. The system in package device of claim 12, wherein the first conductive layer of the logic chip is one of a plurality of first conductive layers arranged along an edge of the interface chip, wherein each of the second conductive layers is connected to a corresponding one of the plurality of first conductive layers of the logic chip.

* * * * *